United States Patent
Merilo et al.

(10) Patent No.: US 7,439,620 B2
(45) Date of Patent: Oct. 21, 2008

(54) INTEGRATED CIRCUIT PACKAGE-IN-PACKAGE SYSTEM

(75) Inventors: Leo A. Merilo, Singapore (SG);
Emmanuel Espiritu, Singapore (SG);
Philip Lyndon Cablao, Singapore (SG);
Dario S. Filoteo, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 97 days.

(21) Appl. No.: 11/462,537

(22) Filed: Aug. 4, 2006

(65) Prior Publication Data

US 2008/0029905 A1    Feb. 7, 2008

(51) Int. Cl.
*H01L 23/34* (2006.01)
(52) U.S. Cl. ..................... 257/723; 257/686
(58) Field of Classification Search ......... 257/723, 257/686
See application file for complete search history.

(56) References Cited

U.S. PATENT DOCUMENTS

| | | | | |
|---|---|---|---|---|
| 5,273,938 | A | * | 12/1993 | Lin et al. .................... 438/107 |
| 6,080,264 | A | | 6/2000 | Ball |
| 6,087,722 | A | | 7/2000 | Lee et al. |
| 6,104,084 | A | | 8/2000 | Ishio et al. |
| 6,603,072 | B1 | | 8/2003 | Foster et al. |
| 7,008,822 | B2 | * | 3/2006 | Bolken et al. ............... 438/109 |
| 7,202,554 | B1 | * | 4/2007 | Kim et al. .................... 257/686 |
| 7,227,252 | B2 | * | 6/2007 | Bolken et al. ............... 257/686 |
| 2006/0022315 | A1 | | 2/2006 | Huang et al. |

* cited by examiner

*Primary Examiner*—Roy K Potter
(74) *Attorney, Agent, or Firm*—Mikio Ishimaru

(57) ABSTRACT

An integrated circuit package-in-package system is provided including forming an external interconnect having an upper portion and a lower portion; forming a packaged device; mounting an active device over the packaged device; connecting the active device to the packaged device and the upper portion; and molding the packaged device, the active device, and the upper portion.

20 Claims, 5 Drawing Sheets

INTEGRATED CIRCUIT PACKAGE-IN-PACKAGE SYSTEM

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Numerous technologies have been developed to meet these requirements. Some of the research and development strategies focus on new technologies while others focus on improving the existing and mature technologies. Research and development in the existing technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality.

A variation of existing technologies uses mature package technologies with lead fingers made from lead frames. Typical lead frame packaging schemes pack more integrated circuits into a single package. As lead frame based packaging technologies are used with new integration and stacking structures, overall package yield becomes a concern.

Thus, a need still remains for an integrated circuit package-in-package system providing low cost manufacturing, reduced form factor, and improved yield for the integrated circuit package-in-package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-in-package system including forming an external interconnect having an upper portion and a lower portion; forming a packaged device; mounting an active device over the packaged device; connecting the active device to the packaged device and the upper portion; and molding the packaged device, the active device, and the upper portion.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
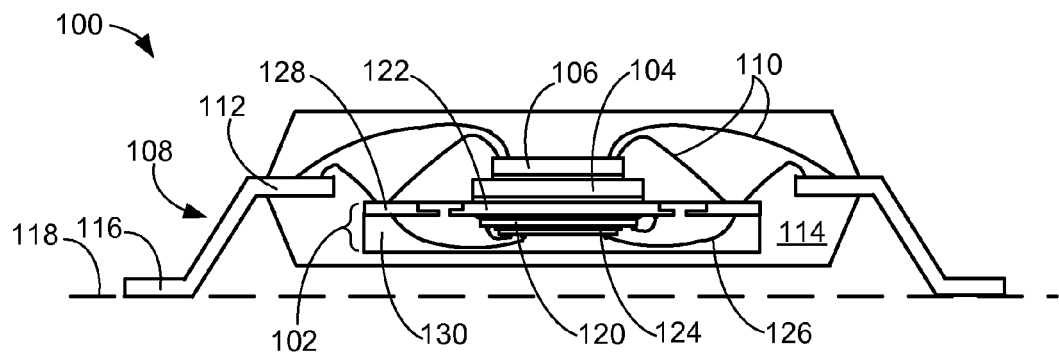
FIG. 1 is a perspective view of an integrated circuit package-in-package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a perspective view of an integrated circuit package-in-package system 100 in an embodiment of the present invention. The integrated circuit package-in-package system 100 may be a number of package types, such as a quad flat package (QFP). A packaged device 102, such as an integrated circuit package system, is below a paddle 104, such as a die-attach paddle. An active device 106, such as an integrated circuit die, is above the paddle 104 and the packaged device 102.

For illustrative purposes, the active device 106 is shown as an integrated circuit die, although it is understood that the active device 106 may not be an integrated circuit die, such as a packaged device, a packaged component, a sensor, or a microelectromechanical system. Also for illustrative purposes, the integrated circuit package-in-package system 100 is shown having the paddle 104, although it is understood that the integrated circuit package-in-package system 100 may not have the paddle 104.

The packaged device 102, the active device 106, and the paddle 104 are between external interconnects 108, such as leads. Internal interconnects 110, such as bond wires or ribbon bond wires, connect the packaged device 102 and the device to upper portions 112 of the external interconnects 108. The internal interconnects 110 also connect the packaged device 102 to the active device 106. The paddle 104 and the upper portions 112 are substantially coplanar.

An encapsulation 114, such as a cover of epoxy mold compound, covers the packaged device 102, the active device 106, the paddle 104, the internal interconnects 110, and the upper portions 112 of the external interconnects 108. Lower portions 116 of the external interconnects 108 are exposed for further connections to an electronic system 118, such as a cellular phone or another integrated circuit package. The encapsulation 114 do not impede the connections between the external interconnects 108 to the electronic system 118.

The packaged device 102 has a first integrated circuit die 120 on a mount structure 122. The mount structure 122 may serve multiple functions, such as a die-attach paddle, an electromagnetic interference (EMI) shield, or a heat spreader. The mount structure 122 attaches to the paddle 104. A second integrated circuit die 124 is stacked on the first integrated circuit die 120. Intra-package interconnects 126, such as bond wires, connect the first integrated circuit die 120 and the second integrated circuit die 124 to external contacts 128, such as leads, of the packaged device 102. The external contacts 128 are for further connections, such as connection with the internal interconnects 110 to the active device 106 and the external interconnects 108. The packaged device 102 may be tested ensuring known good device (KGD) prior to assembly of the integrated circuit package-in-package system 100.

A cover 130, such as a cover of epoxy mold compound or a shell, surrounds the first integrated circuit die 120, the second integrated circuit die 124, and the intra-package interconnects 126. The cover 130 partially surrounds the external contacts 128 with surfaces of the external contacts 128 exposed for further connections. The mount structure 122 may be surrounded or partially surrounded by the cover 130.

For illustrative purposes, the packaged device 102 is shown having the first integrated circuit die 120 and the second integrated circuit die 124, although it is understood that the number of integrated circuits may differ. Also for illustrative purposes, the packaged device 102 is shown having the first integrated circuit die 120 stacked below the second integrated circuit die 124, although it is understood that the packaged device 102 may have non-stacked structure. Further for illustrative purposes, the packaged device 102 is shown as a wire bonded quad flat non-leaded (QFN) package, although it is understood that the packaged device 102 may be other types of devices, such as flip chip QFN (fcQFN) package, lead frame chip scale package (LFCSP), variations of bump chip carrier (BCC) package, or small outline non-leaded (SON) package.

Yet for further illustrative purposes, the intra-package interconnects 126 are shown as bond wires, although it is understood that the intra-package interconnects 126 may be different interconnect types, such as solder bumps or planar interconnects. Still further for illustrative purposes, the packaged device 102 is shown having the mount structure 122, although it is understood that the packaged device 102 may not have the mount structure 122 or may provide a different structure for mounting.

Figure 2:
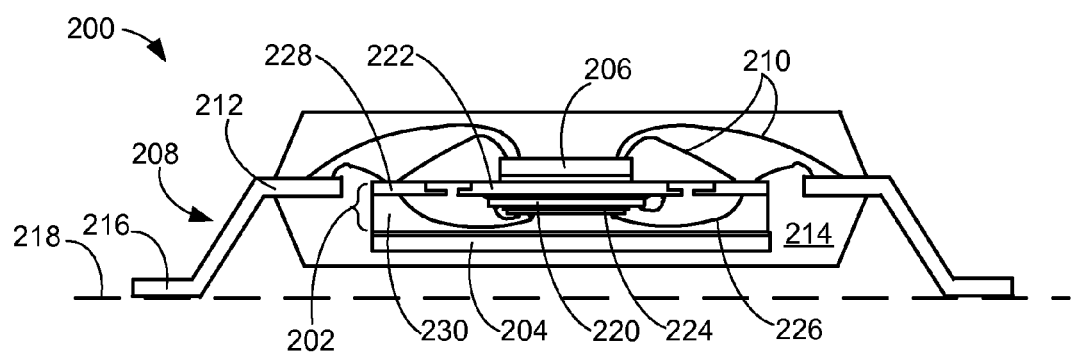
FIG. 2 is a perspective view of an integrated circuit package-in-package system in an alternative embodiment of the present invention.

Referring now to FIG. 2, therein is shown a perspective view of an integrated circuit package-in-package system 200 in an alternative embodiment of the present invention. The integrated circuit package-in-package system 200 may be a number of package types, such as a quad flat package (QFP). A packaged device 202, such as an integrated circuit package system, is over a paddle 204, such as a die-attach paddle. An active device 206, such as an integrated circuit die, is above the packaged device 202 and the paddle 204.

For illustrative purposes, the active device 206 is shown as an integrated circuit die, although it is understood that the active device 206 may not be an integrated circuit die, such as a packaged device, a packaged component, a sensor, or a microelectromechanical system. Also for illustrative purposes, the integrated circuit package-in-package system 200 is shown having the paddle 204, although it is understood that the integrated circuit package-in-package system 200 may not have the paddle 204.

The packaged device 202, the active device 206, and the paddle 204 are between external interconnects 208, such as leads. Internal interconnects 210, such as bond wires or ribbon bond wires, connect the packaged device 202 and the device to upper portions 212 of the external interconnects 208. The internal interconnects 210 also connect the packaged device 202 to the active device 206. The paddle 204 is below the upper portions 212 and above lower portions 216 of the external interconnects 208.

An encapsulation 214, such as a cover of epoxy mold compound, covers the packaged device 202, the active device 206, the paddle 204, the internal interconnects 210, and the upper portions 212 of the external interconnects 208. The lower portions 216 of the external interconnects 208 are exposed for further connections to an electronic system 218, such as a cellular phone or another integrated circuit package. The encapsulation 214 do not impede the connections between the external interconnects 208 to the electronic system 218.

The packaged device 202 has a first integrated circuit die 220 on a mount structure 222. The mount structure 222 may serve multiple functions, such as a die-attach paddle, an electromagnetic interference (EMI) shield, or a heat spreader. The active device 206 is over the mount structure 222 at a side of the mount structure 222 opposite the first integrated circuit die 220. A second integrated circuit die 224 is stacked on the first integrated circuit die 220. Intra-package interconnects 226, such as bond wires, connect the first integrated circuit die 220 and the second integrated circuit die 224 to external contacts 228, such as leads, of the packaged device 202. The external contacts 228 are for further connections, such as connection with the internal interconnects 210 to the active device 206 and the external interconnects 208. The packaged device 202 may be tested ensuring known good device (KGD) prior to assembly of the integrated circuit package-in-package system 200.

A cover 230, such as a cover of epoxy mold compound or a shell, surrounds the first integrated circuit die 220, the second integrated circuit die 224, and the intra-package interconnects 226. The cover 230 partially surrounds the external contacts 228 with surfaces of the external contacts 228 exposed for further connections. The mount structure 222 may be surrounded or partially surrounded by the cover 230. The cover 230 attaches to the paddle 204.

For illustrative purposes, the packaged device 202 is shown having the first integrated circuit die 220 and the second integrated circuit die 224, although it is understood that the number of integrated circuits may differ. Also for illustrative purposes, the packaged device 202 is shown having the first integrated circuit die 220 stacked below the second integrated circuit die 224, although it is understood that the packaged device 202 may have non-stacked structure. Further for illustrative purposes, the packaged device 202 is shown as a wire bonded quad flat non-leaded (QFN) package, although it is understood that the packaged device 202 may be other types of devices, such as flip chip QFN (fcQFN) package, lead frame chip scale package (LFCSP), variations of bump chip carrier (BCC) package, or small outline non-leaded (SON) package.

Yet for further illustrative purposes, the intra-package interconnects 226 are shown as bond wires, although it is understood that the intra-package interconnects 226 may be different interconnect types, such as solder bumps or planar interconnects. Still further for illustrative purposes, the packaged device 202 is shown having the mount structure 222, although it is understood that the packaged device 202 may not have the mount structure 222 or may provide a different structure for mounting.

Figure 3:
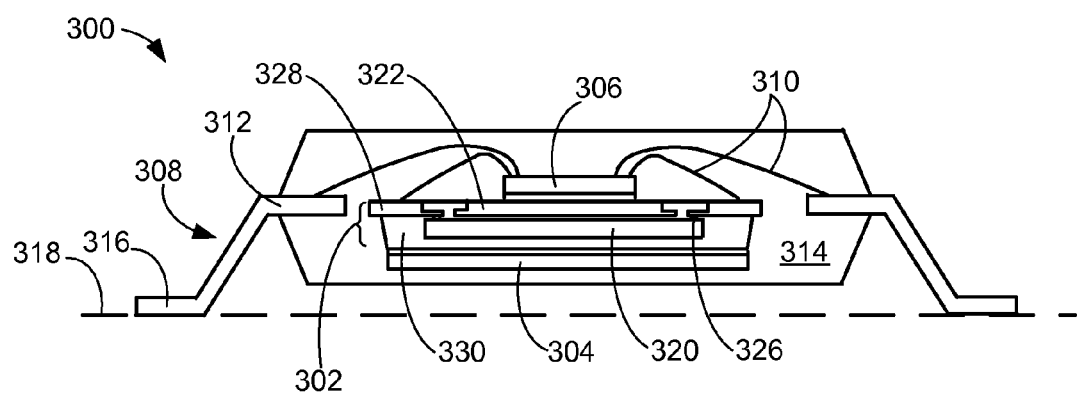
FIG. 3 is a perspective view of an integrated circuit package-in-package system in another alternative embodiment of the present invention.

Referring now to FIG. 3, therein is shown a perspective view of an integrated circuit package-in-package system 300 in another alternative embodiment of the present invention. The integrated circuit package-in-package system 300 may be a number of package types, such as a quad flat package (QFP). A packaged device 302, such as an integrated circuit package system, is over a paddle 304, such as a die-attach paddle. An active device 306, such as an integrated circuit die, is above the packaged device 302 and the paddle 304.

For illustrative purposes, the active device 306 is shown as an integrated circuit die, although it is understood that the active device 306 may not be an integrated circuit die, such as a packaged device, a packaged component, a sensor, or a microelectromechanical system. Also for illustrative purposes, the integrated circuit package-in-package system 300 is shown having the paddle 304, although it is understood that the integrated circuit package-in-package system 300 may not have the paddle 304.

The packaged device 302, the active device 306, and the paddle 304 are between external interconnects 308, such as leads. Internal interconnects 310, such as bond wires or ribbon bond wires, connect the active device 306 to the packaged device 302 and to upper portions 312 of the external interconnects 308. The internal interconnects 310 may also optionally connect (not shown) the packaged device 302 to the upper portions 312. The paddle 304 is below the upper portions 312 and above lower portions 316 of the external interconnects 308.

An encapsulation 314, such as a cover of epoxy mold compound, covers the packaged device 302, the active device 306, the paddle 304, the internal interconnects 310, and the upper portions 312 of the external interconnects 308. The lower portions 316 of the external interconnects 308 are exposed for further connections to an electronic system 318, such as a cellular phone or another integrated circuit package. The encapsulation 314 do not impede the connections between the external interconnects 308 to the electronic system 318.

The packaged device 302 has an integrated circuit die 320 below a mount structure 322. The mount structure 322 may serve multiple functions, such as a die-attach paddle, an electromagnetic interference (EMI) shield, or a heat spreader. The active device 306 is over the mount structure 322 at a side of the mount structure 322 opposite the integrated circuit die 320. Intra-package interconnects 326, such as solder bumps, connect the integrated circuit die 320 to external contacts 328, such as leads, of the packaged device 302. The external contacts 328 are for further connections, such as connection with the internal interconnects 310 to the active device 306 and optionally (not shown) to the external interconnects 308. The packaged device 302 may be tested ensuring known good device (KGD) prior to assembly of the integrated circuit package-in-package system 300.

A cover 330, such as a cover of epoxy mold compound or a shell, surrounds the integrated circuit die 320 and the intra-package interconnects 326. The cover 330 partially surrounds the external contacts 328 with surfaces of the external contacts 328 exposed for further connections. The mount structure 322 may be surrounded or partially surrounded by the cover 330. The cover 330 attaches to the paddle 304.

For illustrative purposes, the packaged device 302 is shown having the integrated circuit die 320, although it is understood that the number of integrated circuits may differ in various configurations, such as stacked or non-stacked. Also for illustrative purposes, the packaged device 302 is shown as a flip chip quad flat non-leaded (fcQFN) package, although it is understood that the packaged device 302 may be other types of devices, such as wire bonded QFN package of stacked or non-stacked configuration, lead frame chip scale package (LFCSP), variations of bump chip carrier (BCC) package, or small outline non-leaded (SON) package.

Further for illustrative purposes, the intra-package interconnects 326 are shown as solder bumps, although it is understood that the intra-package interconnects 326 may be different interconnect types, such as conductive posts or planar interconnects. Yet further for illustrative purposes, the packaged device 302 is shown having the mount structure 322, although it is understood that the packaged device 302 may not have the mount structure 322 or may provide a different structure for mounting.

Figure 4:
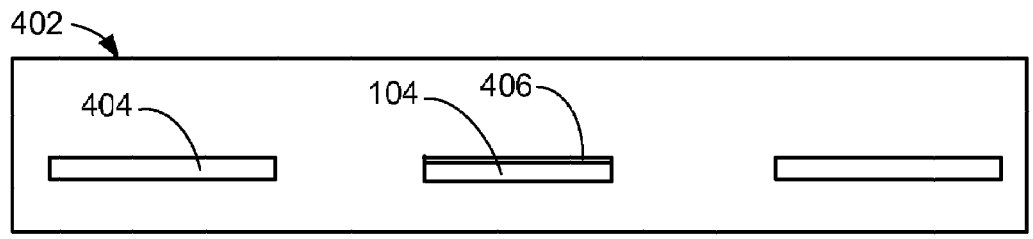
FIG. 4 is a cross-sectional view of the integrated circuit package-in-package system of FIG. 1 in a frame formation phase.

Referring now to FIG. 4, therein is shown a cross-sectional view of the integrated circuit package-in-package system 100 of FIG. 1 in a frame formation phase. A lead frame 402 is formed with the paddle 104 between connectors 404, such as leads. The lead frame 402 has an array of a group having the paddle 104 and the connectors 404. A first adhesive 406, such as a attach adhesive or film, is applied on the paddle 104.

Figure 5:
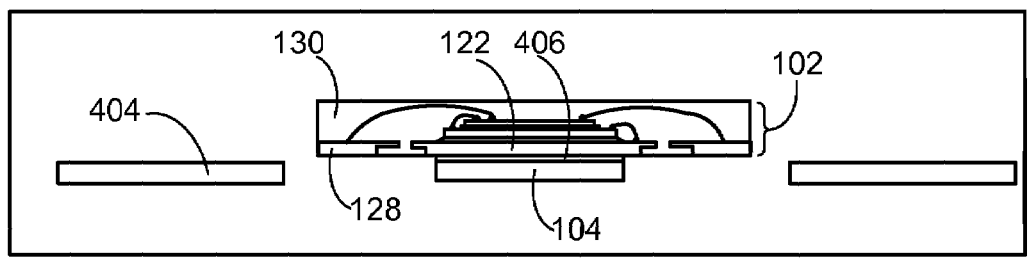
FIG. 5 is the structure of FIG. 4 in a device attach phase.

Referring now to FIG. 5, therein is shown the structure of FIG. 4 in a device attach phase. The mount structure 122 of the packaged device 102 is attached to the paddle 104 with the first adhesive 406. The cover 130 between the mount structure 122 and the external contacts 128 may optionally attach to the paddle 104 with the first adhesive 406. The external contacts 128 are between the paddle 104 and the connectors 404.

Figure 6:
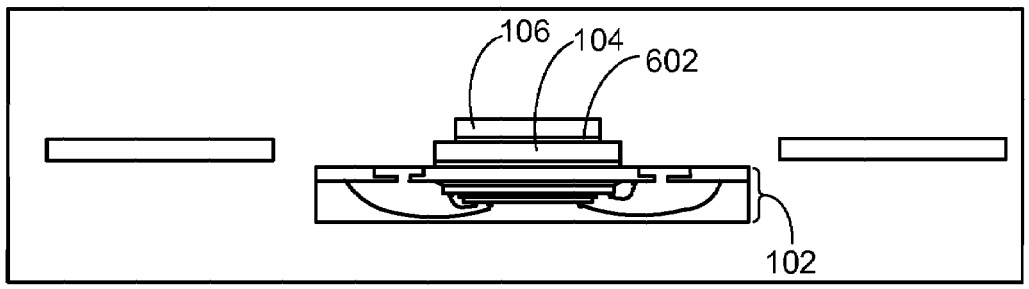
FIG. 6 is the structure of FIG. 5 in another device attach phase.

Referring now to FIG. 6, therein is shown the structure of FIG. 5 in another device attach phase. The structure of FIG. 5 is in a vertically flipped orientation. A second adhesive 602, such as die-attach adhesive, is applied on the paddle 104 on the side opposite the packaged device 102. The active device 106 is attached to the paddle 104 with the second adhesive 602.

Figure 7:
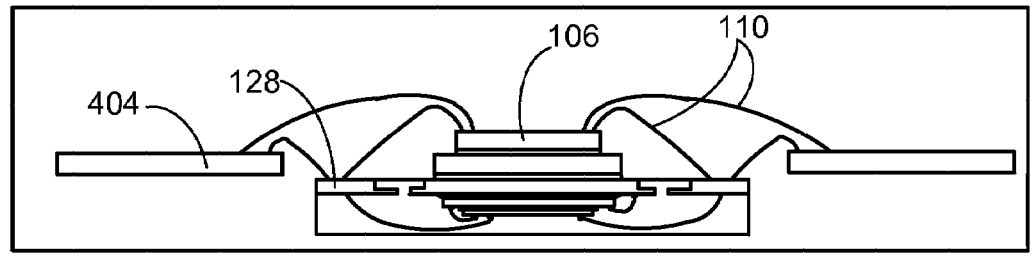
FIG. 7 is the structure of FIG. 6 in an interconnect attach phase.

Referring now to FIG. 7, therein is shown the structure of FIG. 6 in an interconnect attach phase. The internal interconnects 110 are attached between the active device 106 and the external contacts 128 as well as between the external contacts 128 and the connectors 404. The internal interconnects 110 are also attached between the active device 106 and the connectors 404.

Figure 8:
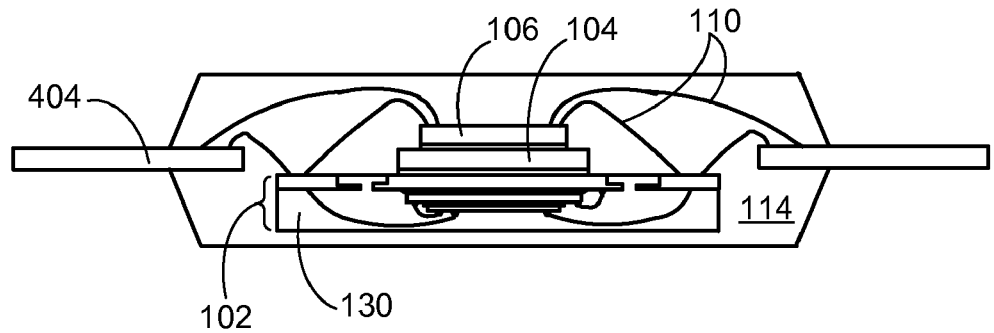
FIG. 8 is the structure of FIG. 7 in a molding phase.

Referring now to FIG. 8, therein is shown the structure of FIG. 7 in a molding phase. The encapsulation 114 is formed to cover the packaged device 102, the paddle 104, the active device 106, and the internal interconnects 110. The encapsulation 114 also covers a portion of the connectors 404. The cover 130 is also in the encapsulation 114. The encapsulation 114 may be formed by any number of processes, such as double sided molding, injection molding, or compression molding.

Figure 9:
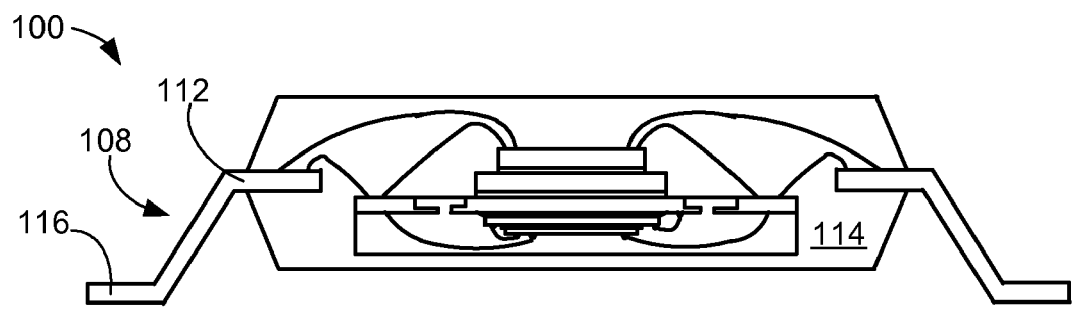
FIG. 9 is the structure of FIG. 8 in a singulation phase.

Referring now to FIG. 9, therein is shown the structure of FIG. 8 in a singulation phase. The connectors 404 of FIG. 8 are bent to form the external interconnects 108 having the upper portions 112 in the encapsulation 114 and the lower portions 116 exposed for further connections. The lead frame 402 of FIG. 4 having the array of the structure of FIG. 8, with the connectors 404 bent, undergoes singulation to form the integrated circuit package-in-package system 100.

Figure 10:
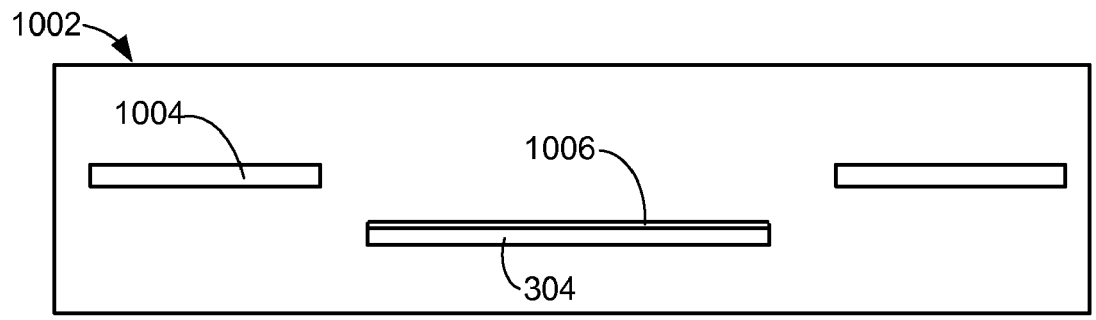
FIG. 10 is a cross-sectional view of the integrated circuit package-in-package system of FIG. 3 in a frame formation phase.
Figure 11:
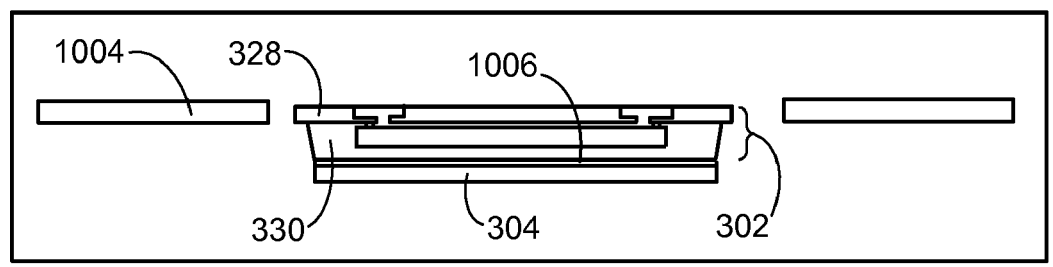
FIG. 11 is the structure of FIG. 10 in a device attach phase.

Referring now to FIG. 10, therein is shown a cross-sectional view of the integrated circuit package-in-package system 300 of FIG. 3 in a frame formation phase. A lead frame 1002 is formed with the paddle 304 between and below connectors 1004, such as leads. The lead frame 1002 has an array of a group having the paddle 304 and the connectors 1004. A first adhesive 1006, such as a attach adhesive or film, is applied on the paddle 304.

Referring now to FIG. 1, therein is shown the structure of FIG. 10 in a device attach phase. The cover 330 of the packaged device 302 is attached to the paddle 304 with the first adhesive 1006. The external contacts 328 are between the connectors 1004.

Figure 12:
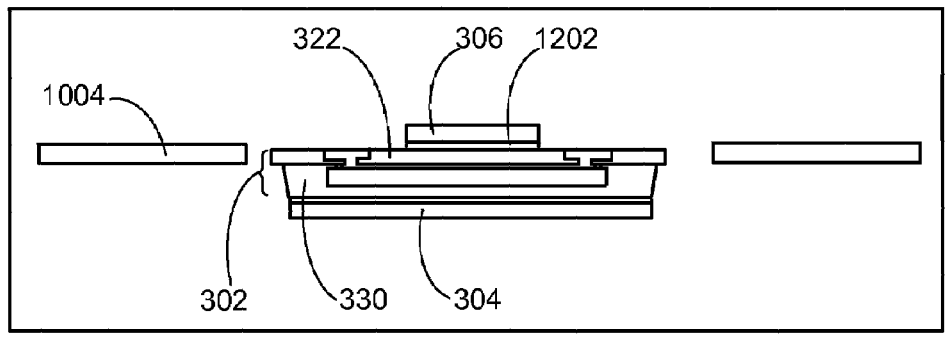
FIG. 12 is the structure of FIG. 11 in another device attach phase.

Referring now to FIG. 12, therein is shown the structure of FIG. 1 in another device attach phase. A second adhesive 1202, such as die-attach adhesive, is applied on the mount structure 322, the cover 330, or both. The active device 306 is attached to the packaged device 302 with the second adhesive 1202. The active device 306 is also over the paddle 304 and between the connectors 1004.

Figure 13:
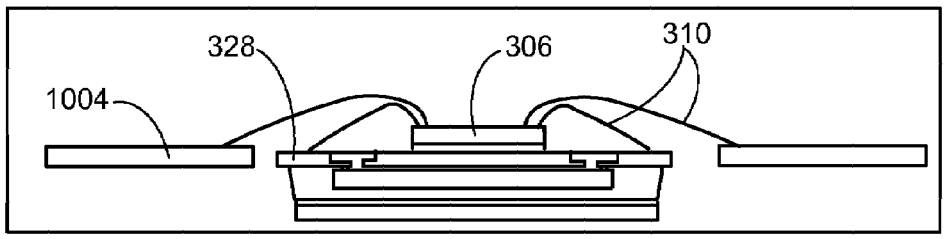
FIG. 13 is the structure of FIG. 12 in an interconnect attach phase.

Referring now to FIG. 13, therein is shown the structure of FIG. 12 in an interconnect attach phase. The internal interconnects 310 are attached between the active device 306 and the external contacts 328. The internal interconnects 310 are also attached between the active device 306 and the connectors 1004. Optionally (not shown), the internal interconnects 310 may also connect between the external contacts 328 and the connectors 1004.

Figure 14:
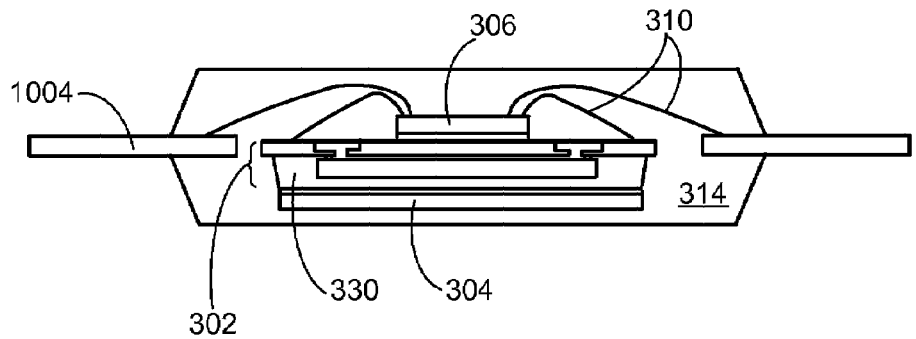
FIG. 14 is the structure of FIG. 13 in a molding phase.

Referring now to FIG. 14, therein is shown the structure of FIG. 13 in a molding phase. The encapsulation 314 is formed to cover the packaged device 302, the paddle 304, the active device 306, and the internal interconnects 310. The encapsulation 314 also covers a portion of the connectors 1004. The cover 330 is also in the encapsulation 314. The encapsulation 314 may be formed by any number of processes, such as double sided molding, injection molding, or compression molding.

Figure 15:
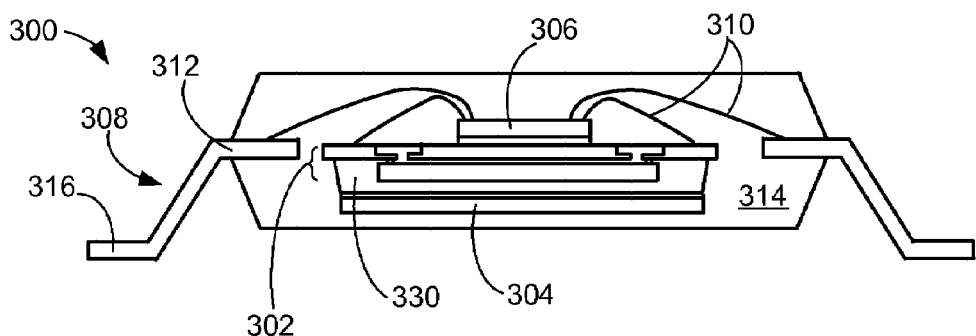
FIG. 15 is the structure of FIG. 14 in a singulation phase.

Referring now to FIG. 15, therein is shown the structure of FIG. 14 in a singulation phase. The connectors 1004 of FIG. 14 are bent to form the external interconnects 308 having the upper portions 312 in the encapsulation 314 and the lower portions 316 exposed for further connections. The lead frame 1002 of FIG. 10 having the array of the structure of FIG. 14, with the connectors 1004 bent, undergoes singulation to form the integrated circuit package-in-package system 300.

Figure 16:
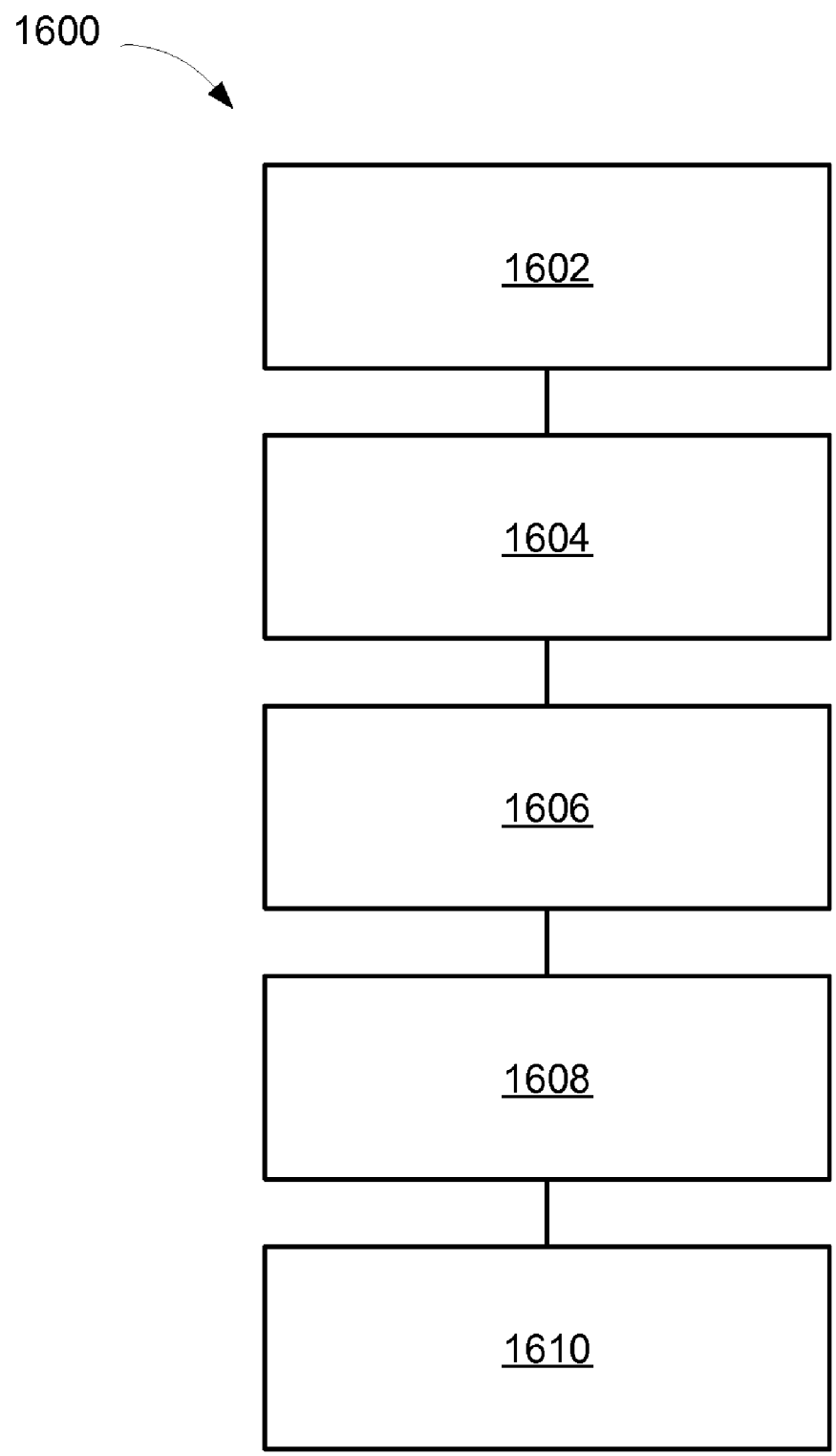
FIG. 16 is a flow chart of an integrated circuit package-in-package system for manufacture of the integrated circuit package-in-package system in an embodiment of the present invention.

Referring now to FIG. 16, therein is shown a flow chart of an integrated circuit package-in-package system 1600 for manufacture of the integrated circuit package-in-package system 100 in an embodiment of the present invention. The system 1600 includes forming an external interconnect having an upper portion and a lower portion in a block 1602; forming a packaged device in a block 1604; mounting an active device over the packaged device in a block 1606; connecting the active device to the packaged device and the upper portion in a block 1608; and molding the packaged device, the active device, and the upper portion in a block 1610.

It has been discovered that the present invention thus has numerous aspects.

It has been discovered that the present invention provides functional extensions to quad flat packages improving yield, reducing package profile, and lowering cost. The present invention allows for QFP to form package-in-package structure with various internal package types, stacked structure, warpage mitigation structure, and for EMI shielding.

An aspect of the present invention allows the packaged device to be tested prior to assembly in the package-in-package structure of the present invention. The packaged device may have integrated circuit, passive components, or both in a configuration that is stacked, non-stacked, or both.

Another aspect of the present invention allows for the package-in-package structure to integrated ultra thin or aggressively thinned integrated circuits in the packaged device. The packaged device protects the thinned integrated circuits to withstand additional handling. The aggressively thinned wafer allows the packaged device to have a thin profile despite the cover.

Yet another aspect of the present invention provides an EMI shield between the integrated circuits in the packaged device and the integrated circuits outside the packaged device. This improves electrical performance and performance governmental compliance tests.

Yet another aspect of the present invention provides a low profile, direct connection between Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-in-package system method of the present invention furnishes important and heretofore unknown and unavailable solutions, capabilities, and functional aspects for improving reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package-in-package system comprising:
   forming an external interconnect having an upper portion and a lower portion;
   forming a cover under a first integrated circuit die to form a packaged device;
   mounting an active device over the packaged device;
   connecting the active device to the packaged device and the upper portion; and
   molding an encapsulation around the cover of the packaged device, the active device, and the upper portion.

2. The system as claimed in claim 1 wherein mounting the active device includes forming an integrated circuit die.

3. The system as claimed in claim 1 wherein forming the packaged device includes mounting a second integrated circuit die under the first integrated circuit die.

4. The system as claimed in claim 1 wherein the molding includes exposing the lower portion.

5. The system as claimed in claim 1 further comprising:
   forming a paddle; and
   mounting the packaged device over the paddle.

6. An integrated circuit package-in-package system comprising:
   forming an external interconnect, having an upper portion and a lower portion, and a paddle;
   a cover under a first integrated circuit die to form a packaged device;
   mounting the packaged device, having an external contact, on the paddle;
   mounting an active device over the packaged device and the paddle;
   connecting the active device to the external contact and the upper portion; and
   molding an encapsulation around the cover of the packaged device, the active device, the paddle, and the upper portion.

7. The system as claimed in claim 6 wherein the connecting includes connecting external contact and the upper portion.

8. The system as claimed in claim 6 wherein mounting the packaged device on the paddle includes attaching the cover of the packaged device to the paddle.

9. The system as claimed in claim 6 wherein mounting the packaged device on the paddle includes attaching a mount structure of the packaged device to the paddle.

10. The system as claimed in claim 6 further comprising forming an electronic system having the integrated circuit package-in-package system.

11. An integrated circuit package-in-package system comprising:
    an external interconnect having an upper portion and a lower portion;
    a packaged device having a cover under a first integrated circuit die;
    an active device over the packaged device;
    an internal interconnect from the active device to the packaged device and the upper portion; and
    an encapsulation round the cover of the packaged device, the active device, and the upper portion.

12. The system as claimed in claim 11 wherein the active device is an integrated circuit die.

13. The system as claimed in claim 11 wherein the packaged device includes a second integrated circuit die under the first integrated circuit die.

14. The system as claimed in claim 11 wherein the encapsulation has the lower portion exposed.

15. The system as claimed in claim 11 further comprising a paddle with the packaged device thereon.

16. The system as claimed in claim 11 wherein:
    the external interconnect is a lead having the upper portion and the lower portion;
    the packaged device has an external contact;
    the active device has an integrated circuit over the packaged device;
    the internal interconnect, from the active device to the packaged device and to the upper portion, is a wire;
    the encapsulation to cover the packaged device, the active device, and the upper portion has the lower portion exposed; and
  further comprising:
    a paddle with the packaged device over the paddle.

17. The system as claimed in claim 16 wherein the internal interconnect is between external contact and the upper portion.

18. The system as claimed in claim 16 wherein the packaged device has a cover to the paddle.

19. The system as claimed in claim 16 wherein the packaged device has a mount structure to the paddle.

20. The system as claimed in claim 16 further comprising an electronic system having the integrated circuit package-in-package system.

* * * * *

UNITED STATES PATENT AND TRADEMARK OFFICE
CERTIFICATE OF CORRECTION

PATENT NO. : 7,439,620 B2  Page 1 of 1
APPLICATION NO. : 11/462537
DATED : October 21, 2008
INVENTOR(S) : Merilo et al.

It is certified that error appears in the above-identified patent and that said Letters Patent is hereby corrected as shown below:

Title Page, item (73), Assignee:
 delete "Stats Chippac Ltd." and insert therefor --STATS CHIPPAC LTD.--

Column 9, line 30, delete "a cover" and insert therefor --forming a cover--

Signed and Sealed this

Ninth Day of December, 2008

JON W. DUDAS
*Director of the United States Patent and Trademark Office*